United States Patent [19]

Neinast et al.

[11] Patent Number: 5,318,179
[45] Date of Patent: Jun. 7, 1994

[54] PACKAGE FOR MICROELECTRIC WIRE TEST BOARDS

[76] Inventors: James E. Neinast, 5200 Carmel Park Dr., Charlotte, N.C. 28226; Mark E. Neinast, 3075 Drayton Hall Way, Gastonia, N.C. 28056

[21] Appl. No.: 947,822

[22] Filed: Sep. 21, 1992

[51] Int. Cl.$^5$ ............................................. B65D 73/02
[52] U.S. Cl. ..................................... 206/330; 206/328; 206/331; 206/460; 206/820
[58] Field of Search ............... 206/328, 330, 331, 460, 206/477, 516, 499, 820

[56] References Cited

U.S. PATENT DOCUMENTS

| | | |
|---|---|---|
| 3,147,086 | 9/1964 | Batcheller et al. ................ 206/820 |
| 3,238,455 | 3/1966 | Jankowski ......................... 206/331 |
| 3,331,497 | 7/1967 | Lunsford ........................... 206/331 |
| 3,494,004 | 2/1970 | Bone .................................. 206/820 |
| 4,223,786 | 9/1980 | Hori ................................... 206/300 |
| 4,993,553 | 2/1991 | Kicherer et al. .................. 206/499 |
| 5,050,732 | 9/1991 | Hunsicker ......................... 206/331 |
| 5,061,102 | 10/1991 | Rennie ............................. 206/820 |

Primary Examiner—David T. Fidei
Attorney, Agent, or Firm—Clifton Ted Hunt

[57] ABSTRACT

The prior art packaging of microelectric wires that have had insulation stripped from at least one end to permit the wires to be used in an electric circuit has applied adhesive to the backs of the paddleboards to which the microelectric wires are connected for testing. The adhesive is objectionable because residues of adhesive remain on the paddleboards and interferes with subsequent operations. The package of this invention eliminates adhesive on the paddleboards by forming the bottom layer of the paddleboards with frangible ligaments that are connected to a transversely extending spine. A base supports the paddleboards and spine, and it is the spine, not the paddleboards, that is connected to the underlying base. Each paddleboard can be removed from the spine and from the package by breaking the frangible ligament connecting that paddleboard to the spine. In one embodiment of the invention, each paddleboard is mounted in a recessed tray wherein a group of projections rise within the recessed body of the tray to the top of the tray. The spine has a corresponding group of openings therethrough which register with the projections in a first tray when a group of paddleboards is assembled within said first tray. The projections within said first tray penetrate the openings in the spine of the paddleboards within said first tray and extend into engagement with a second tray on top of said first tray.

7 Claims, 3 Drawing Sheets

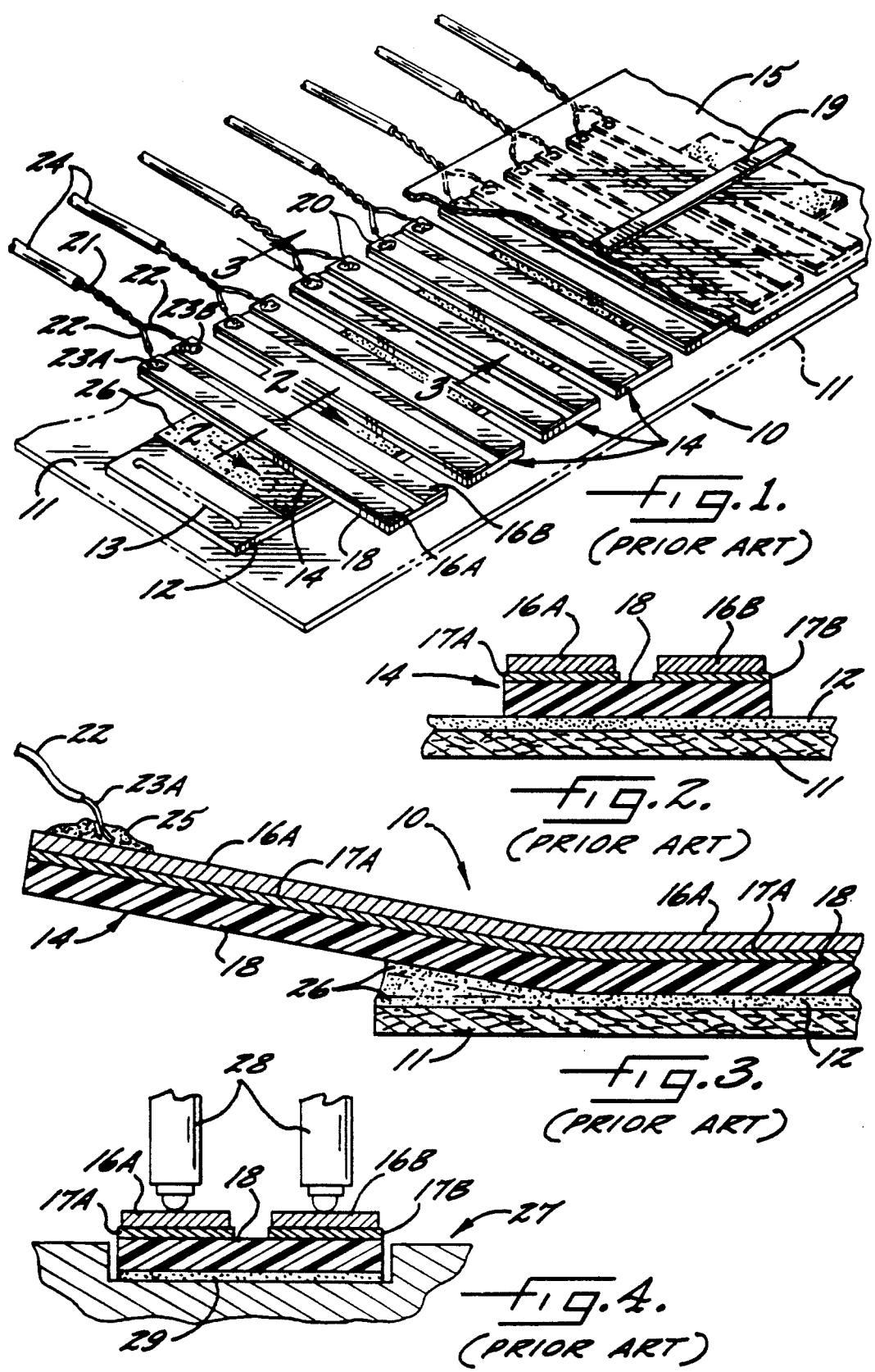

PACKAGE FOR MICROELECTRIC WIRE TEST BOARDS

FIELD OF THE INVENTION

This invention is in the field of microelectronics, and specifically relates to the packaging of microelectric wire test boards for shipment and handling prior to the microelectric wires being installed in their intended environment, such as computers.

BACKGROUND OF THE INVENTION

One segment of the computer industry prepares microelectric wires, or microwires, having a predetermined length of, for example, three inches and a diameter in the range of 0.001 to 0.002 inches, for installation by another segment of the computer industry in the hard drive systems of computers.

Each of the microwires is insulated by a thin enamel coating. A specific length of insulation is stripped from at least one end of each microwire before twisting two or more of the microwires together to form a microwire electrical conductor with two or more strands (herein called microelectric wires).

The microelectric wires are cut to precise predetermined lengths and corresponding ends of the wires are attached to a printed circuit board or test board (generally known in the industry as a paddleboard) before being packaged for shipment to a member of that segment of the computer industry that installs the microelectric wires in the hard drive systems of computers, or other desired environment.

The paddleboards are miniature printed circuit boards of three ply construction. An upper layer comprises two or more spaced strips of tin/lead solder laminated to an intermediate layer defined by a like number of strips of a copper substrate which is, in turn, laminated to a non-conductive base or bottom layer, preferably formed from epoxy resin-bonded cellulosic board. The strips of tin/lead solder are soldered to corresponding ends of the strands of a microelectric wire to form an electric connection.

The paddleboards, with a microelectric wire attached to each board, have heretofore been packaged for shipment by first arranging a plurality of the paddleboards (twenty, for example) in a row with the paddleboards in juxtaposition to each other and holding the paddleboards in place with a strip of adhesive tape attached to the backs of the juxtaposed paddleboards. The adhesive tape is fastened, as by staples, to a suitable base, such as a stiff sheet of paperboard measuring approximately four by six inches. A second sheet of correspondingly sized paperboard is used to cover the paddleboard and protect the microelectric wires. The two juxtaposed sheets of paperboard are held together, with the paddleboard and wires sandwiched between them, as by rubber bands, to complete the prior art package.

It is known to practitioners of the art that a residue of adhesive from the adhesive tape used in the prior art package undesirably remains on the backs of the paddleboards when they are removed from the package. This residue of adhesive is objectionable because it often causes the paddleboard to become accidentally stuck to something, disrupting the normal flow of work with a consequent loss of production.

When a paddleboard is placed in the test block for testing of the electric circuit, a portion of the adhesive residue on the back of the paddleboard is transferred to the test block. After a plurality of paddleboards have been tested in the test block, there is an undesirable accumulation of adhesive in the test block, which interferes with its satisfactory use.

SUMMARY OF THE INVENTION

It is a primary object of this invention to overcome the difficulties caused by the residue of adhesive remaining on the backs of the prior art paddleboards after they are removed from their package.

According to the invention, each paddleboard in a group is releasably connected by a frangible ligament to a unifying spine. It is only the spine, not the paddleboards, that is attached to a base, as by adhesive or other suitable means. The base may be a stiff sheet of paperboard as in the prior art or it may be one of a group of recessed trays that include means to quickly and easily support the trays, when assembled with a group of paddleboards in each tray, in vertical relation to each other to form a package. Regardless of the type of base used, no adhesive is applied to the backs of the paddleboards. Consequently, there is no residual adhesive and no accumulation of adhesive in the test block.

The spine and the frangible ligaments organize and stabilize the group of paddleboards to facilitate the handling of the paddleboards at all stages—while the microelectric wires are being soldered to the paddleboards, during handling for shipment, and while the electric circuitry is being tested.

BRIEF DESCRIPTION OF THE DRAWINGS

FIG. 1 is an enlarged perspective view, with parts broken away, of a prior art package of paddleboards with its strip of adhesive tape stuck to the backs of the paddleboards and fastened to the base with staples;

FIG. 2 is an enlarged sectional view taken substantially along the line 2—2 in FIG. 1;

FIG. 3 is an enlarged sectional view taken substantially along the line 3—3 in FIG. 1 but modified to show the paddleboard being pulled away from the adhesive to remove it from the package;

FIG. 4 is an enlarged sectional view, with parts broken away, showing a portion of a test block with the paddleboard of FIG. 3 positioned for testing;

DETAILED DESCRIPTION OF THE INVENTION

The Prior Art Package

Figure 5:
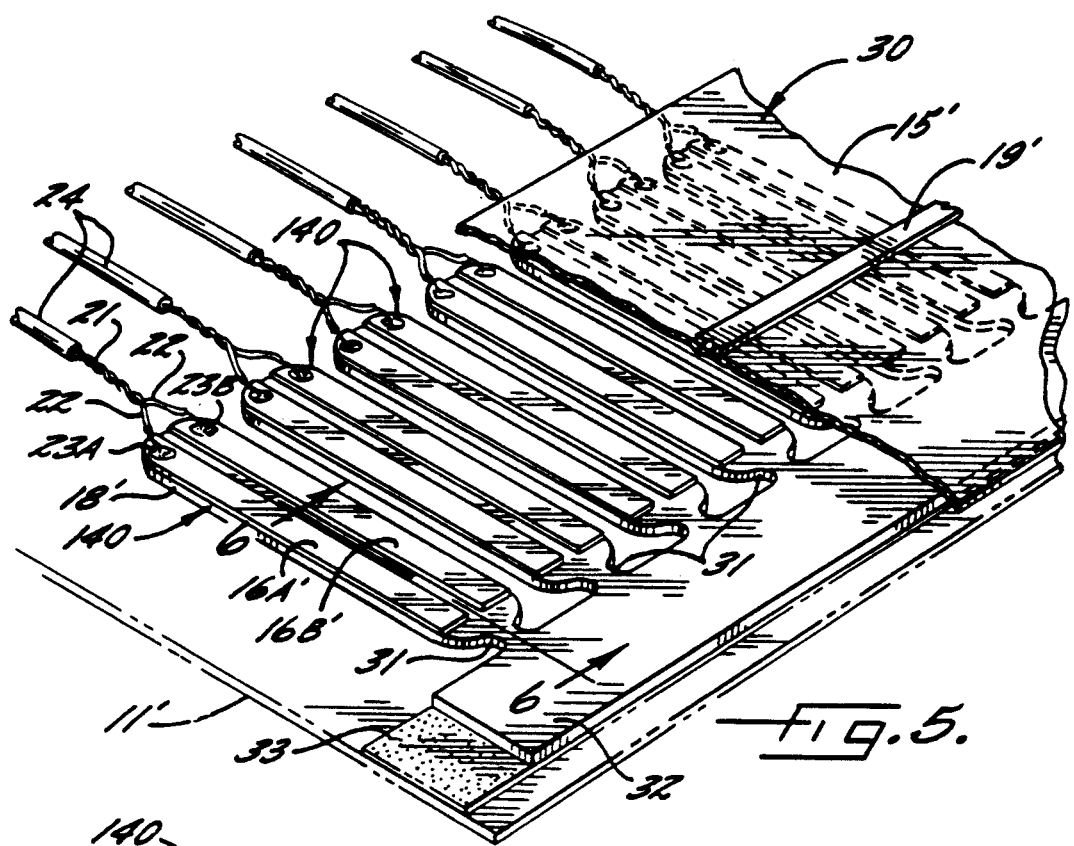
FIG. 5 is an enlarged perspective view, with parts broken away, of the improved package with modified paddleboards, the paperboard base and cover of the package being shown in phantom lines for the purpose of illustration.
Figure 6:
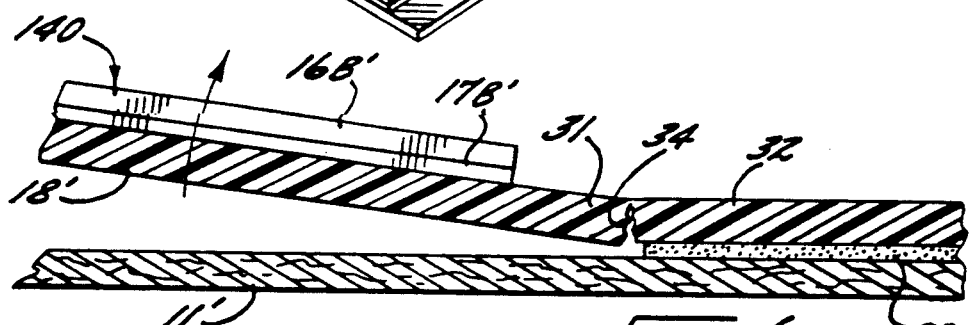
FIG. 6 is an enlarged sectional view taken substantially along the line 6—6 in FIG. 5, but modified to show one of the paddleboards being pulled from the package.
Figure 7:
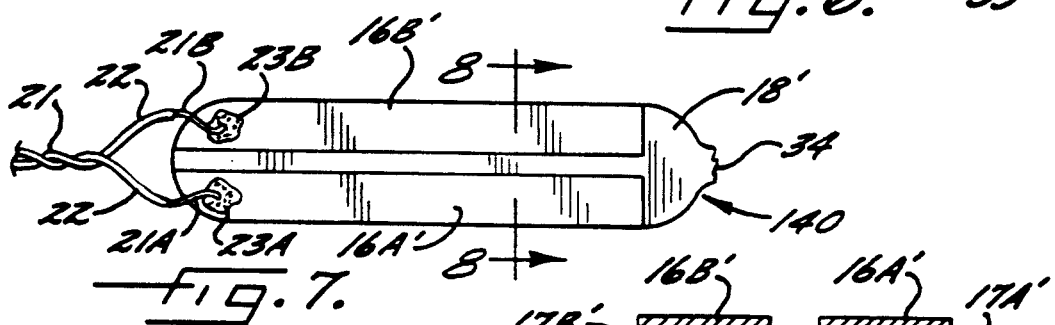
FIG. 7 is an enlarged top view of the paddleboard shown in FIG. 6 after it has been completely removed from the package of FIG. 5.
Figure 8:
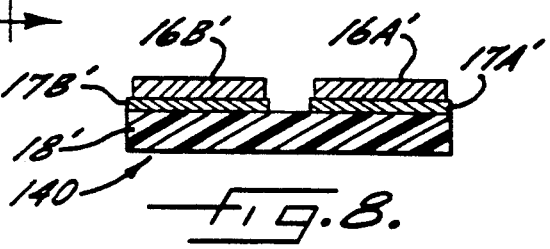
FIG. 8 is a sectional view taken substantially along the line 8—8 in FIG. 7.
Figure 9:
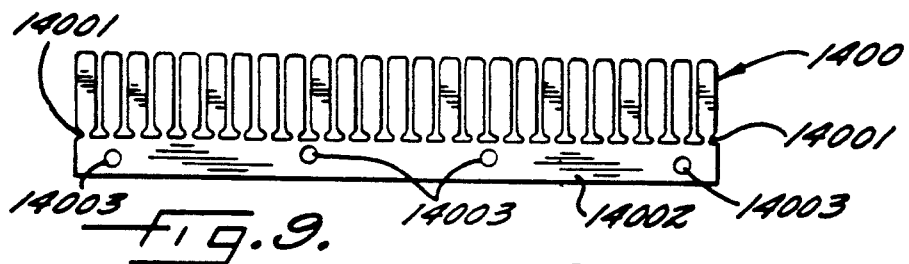
FIG. 9 is a plan view of a second embodiment of the modified paddleboard shown in FIG. 5.

Referring first to FIGS. 1 and 2, the prior art package, broadly indicated at 10, comprises a rectangular base 11 of stiff paperboard, a strip of adhesive tape 12, staples 13 or other suitable fastener for attaching the adhesive tape 12 to the base 11, a plurality of test boards or paddleboards 14, and a stiff paperboard cover 15 corresponding dimensionally to the base 11.

The test boards or paddleboards 14 are miniature printed circuit boards of three ply construction. The upper layer comprises two spaced strips of tin/lead solder 16A and 16B laminated in superposed relation to an intermediate layer defined by two spaced strips of a copper substrate 17A and 17B which are, in turn, laminated to a non-conductive bottom layer or base 18, preferably formed from epoxy resin-bonded cellulosic board.

Corresponding ends 20 of the paddleboards 14 are connected to a like number of microelectric wires 21. The microelectric wires have been prepared for use in the microelectronic industry by removing a precise length of insulation 22 from at least the ends of the wires 21 opposite the ends 23A and 23B which are soldered as at 25 to the spaced strips of tin/lead solder, shown at 16A and 16B, on corresponding paddleboards 14. The ends 23A and 23B are shown to have been stripped before being soldered to the paddleboards, but this is not always done.

A group of paddleboards 14, with microelectric wires 21 attached, have heretofore been packaged as shown in FIG. 1. According to the prior art, the paddleboards 14 are arranged in juxtaposition and held in place by adhesive 26 on the strip of adhesive tape 12 extending along the row of paddleboards. The tape 12 is fastened to the base 11 as by staples 13. The package of the prior art is completed by sandwiching the paddleboards and their wires between the base 11 and a cover 15. The base and cover are usually held against opposite sides of the paddleboards 14 with rubber bands 19.

The user of the microelectric wires removes the paddleboards 14 from the package 10 by first removing the rubber bands and cover 15 and then sequentially pulling the paddleboards 14 away from the adhesive tape 12 and base 11, as illustrated in FIG. 3. After being removed from the package 10, each paddleboard 14 is placed in a test block 27 (FIG. 4), where terminals 28 are placed against the two spaced strips of tin/lead solder 16A and 16B to evaluate the circuitry of the attached microelectric wire 21 in a known manner.

As illustrated in FIG. 3, a residue of the adhesive 26 remains on the paddleboards 14 when they are pulled from the adhesive tape 12. A portion of the adhesive residue is transferred from each paddleboard to the test block 27, eventually resulting in an undesirable accumulation 29 of adhesive 26 in the test block (FIG. 4). The residue of adhesive 26 on the paddleboards and the accumulation 29 of adhesive 26 in the test block are both troublesome.

The Improved Package

First Embodiment

Referring to the embodiment of FIGS. 5–8, an improved package 30 eliminates the use of adhesive on the backs of the paddleboards to hold a group of paddleboards together, and thereby overcomes the problems caused by the adhesive in the prior art package.

The package 30 includes the rectangular paperboard base 11, and the cover 15 used in the prior art package 10. The package 30 uses paddleboards 140 which are substantially functional equivalents of the prior art paddleboards 14, but are modified to include frangible ligaments 31 and a spine 32. The modified paddleboard 140 is otherwise structurally the same as the paddleboard 14, and parts of the modified paddleboard 140 that correspond to parts of the paddleboard 14 bear the same reference number with the prime notation added.

In practice, the non-conductive bottom layer $18^1$ of each paddleboard in the group of paddleboards in the package 30 is formed integrally with a frangible ligament 31 extending between one end of its paddleboard and a spine 32 extending transversely to the axes of the frangible ligaments 31. The bottom layer $18^1$, ligaments 31 and spine 32 are molded as an integral unit from the same epoxy resin-bonded cellulosic board as used in the bottom layer 18 of the paddleboard 14.

The paddleboards are completed by laminating the tin/lead solder strips $16A^1$ and $16B^1$ and the strips of copper substrate $17A^1$ and $17B^1$ to the bottom layer $18^1$. The microelectric wires 21 are then soldered to the spaced strips of tin/lead solder $16A^1$ and $16B^1$ in the same way and for the same purpose as previously explained in regard to the prior art package 10. The microelectric wires used with the package 30 are the same as the microelectric wires 21 used with the prior art package, and the wires and their components used with the package 30 bear the same reference characters as were used in describing the wires used with the prior art package 10.

The spine 32 may be of any desired length to accomodate a desired number of paddleboards. A group of twenty paddleboards has been found to be a convenient number for the package 30. The spine 32, through the rigid ligaments 31, effectively stabilizes a reasonable number of paddleboards for shipment and has the additional advantage of stabilizing the paddleboards while the microelectric wires are soldered to them. The spine 32 is attached to the base $11^1$ and the cover $15^1$ is held in place in any desired manner. In the illustrated embodiment, the spine 32 is fastened to the base $11^1$ by adhesive 33 and the cover $15^1$ is applied and held in place by rubber bands $19^1$, as before, to complete the package.

There is no adhesive applied to the paddleboards 140. Each paddleboard is held on the base $11^1$ by its ligament 31, the spine 32 and the adhesive 33 or other means connecting the spine and the base together. When it is desired to remove the paddleboards 140 for testing, or otherwise, the frangible ligament 31 is broken by lifting the paddleboard away from the base $11^1$ causing a rupture as at 34 (FIG. 6) in the frangible ligament 31. The released paddleboards are used for testing in the usual manner, and the spine is discarded.

Second Embodiment

The second embodiment of the invention is the package 50, whose components are shown in FIGS. 9–12.

The package 50 includes a further modification of the modified paddleboard 140. The further modified paddleboard of the second embodiment is designated by the reference numeral 1400 in FIG. 9. The paddleboard 1400 comprises the same frangible ligaments 31 and spine 32 as the paddleboard 140, designated by respective reference numerals 14001 and 14002 in FIG. 9. The paddleboard 1400 differs from the paddleboard 140 only in the provision of a plurality of holes or openings 14003 through the spine 14002 of the paddleboard 1400. The openings 14003 are spaced a desired distance from each other along the length of the spine 14002.

Figure 10:
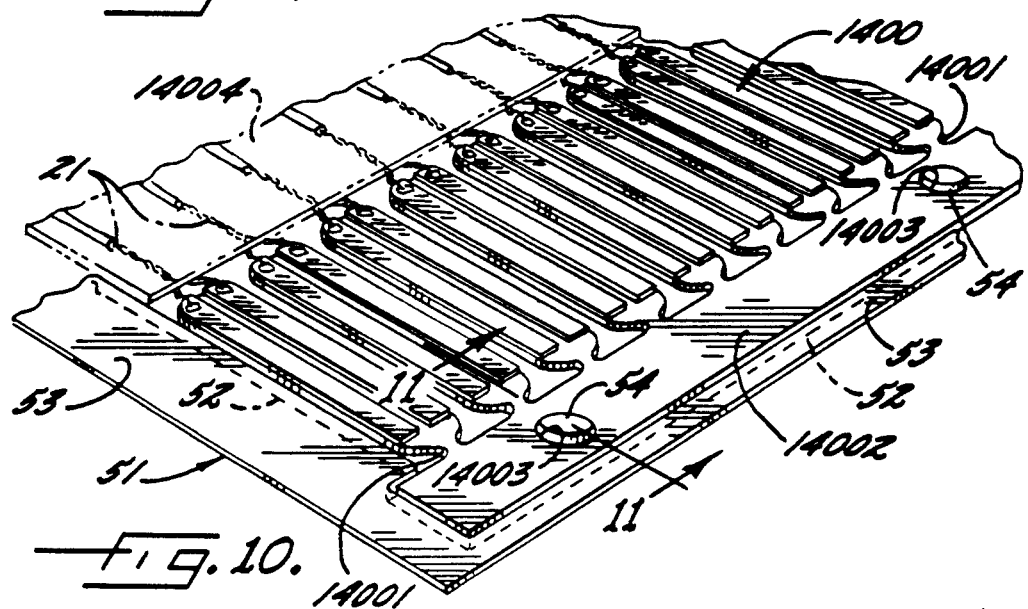
FIG. 10 is an enlarged perspective view of the embodiment of modified paddleboard shown in FIG. 9 positioned in a recessed tray for packaging.
Figure 11:
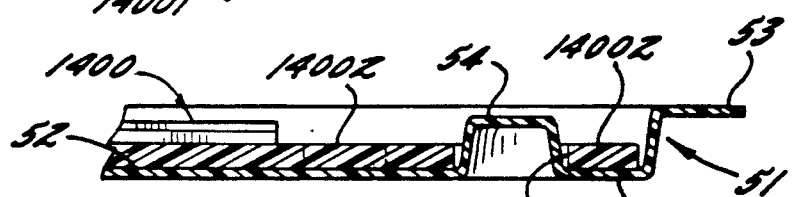
FIG. 11 is a sectional view taken substantially along the line 11—11 in FIG. 10.
Figure 12:
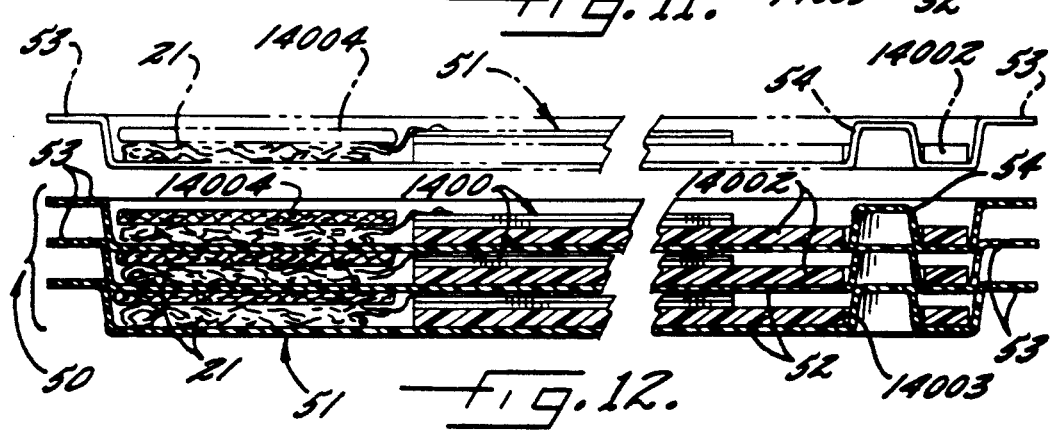
FIG. 12 is a side view of a package comprising a plurality of vertically arranged paddleboards and recessed trays of the type shown in FIG. 10.

The base 11$^1$ of the embodiment shown in FIGS. 5–8 is replaced in the embodiment of FIGS. 9–12 by a recessed tray 51, preferably made from plastic. The body 52 of the tray 51 is recessed below an annular flange 53 extending around the tray 51. The recessed body 52 of the tray 51 is shaped to conform with the dimensions of a group of paddleboards 1400 (twenty, for example) arranged side by side as shown in FIG. 10, and to extend beneath the microwires 21 attached to the paddleboards 1400. The microwires 21 are protected within the recessed tray 1400 by foam pads 14004, or the like (FIG. 12).

The body 52 of the tray 51 is deformed to define upwardly extending projections 54 that correspond in number and location with the openings 14003 through the spine 14002. The diameter of the projections 54 is slightly smaller than the diameter of the openings 14003, and the projections 54 extend through the openings 14003 and terminate in the same plane as the flange 53 on the tray 51.

As can be seen in FIG. 12, the bottom 52 of an upper tray in package 50 seats against the projections 54 on the tray 51 beneath it. Openings 14003 and the projections 54 provide for the automatic and orderly vertical stacking of a plurality of the trays 51, and their contents, to form the package 50.

There are thus provided improved packages for paddleboards which provide all of the advantages of the prior art package, and more, without the disadvantages caused by the prior art application of adhesive to the backs of the paddleboards.

Although specific terms have been used in describing the invention, they are used in a descriptive and generic sense only and not for the purpose of limitation, the scope of the invention being determined from a consideration of the claims with the specification, drawings, and the prior art.

We claim:

1. A package including a group of microelectric wires soldered to a corresponding number of paddleboards arranged in a row in spaced parallel relation to each other, wherein the improvement comprises a spine extending in spaced transverse relation to the paddleboards, and frangible ligaments joined to the paddleboards and to the spine, whereby each paddleboard may be removed from the spine when desired by breaking the frangible ligament between that paddleboard and the spine, a recessed tray underlying the spine, the frangible ligaments, the paddleboards and the microelectric wires connected to the paddleboards, means for connecting only the spine to the recessed tray, and said means comprising a group of projections extending upwardly within a first recessed tray and terminating in the same place as the top of said first recessed tray, said spine having a corresponding group of openings therethrough which register with the projections in said first recessed tray when assembled.

2. A package according to claim 1 wherein the projections in said first recessed tray extend through the openings in the spine and into engagement with a second recessed tray on top of said first recessed tray.

3. A package including a group of microelectric wires soldered to a corresponding number of juxtaposed paddleboards, each paddleboard having a bottom layer of non-conductive material, a substrate of spaced cooper strips and a top layer of spaced tin/lead solder strips laminated together with corresponding ends of the microelectric wires soldered to the tine/lead solder strips at one end of the paddleboards, wherein the improvement comprises a frangible ligament extending from the end of each paddleboard opposite said one end of the paddleboards, a spine extending transversely to the area of the paddleboards and in spaced relation to the ends of the paddleboards opposite said one end of the paddleboards, the frangible ligaments extending between and being joined to the paddleboards and to the spine, whereby each paddleboard may be removed from the spine when desired by breaking the frangible ligament connecting it to the spine, a base underlying the spine, the frangible ligaments, the paddleboards and the microelectric wires connected to the paddleboards, and only the spine being adhesively connected to the base.

4. A package including a group of microelectric wires soldered to a corresponding number of paddleboards arranged in a row in spaced parallel relation to each other, wherein the improvement comprises a spine extending in spaced transverse relation to the paddleboards, and frangible ligaments joined to the paddleboards and to the spine, whereby each paddleboard may be removed from the spine when desired by breaking the frangible ligament between that paddleboard and the spine, a recessed tray underlying the spine, the frangible ligaments, the paddleboards and the microelectric wires connected to the paddleboards, means for connecting only the spine to the recessed tray, and said means for connecting only the spine to the recessed tray comprising a group of projections extending upwardly within the first recessed tray and terminating in the same plane as the top of said first recessed tray, said spine having a corresponding group of openings therethrough which register with the projections in said first recessed tray when assembled.

5. A package according to claim 3 which includes a cover corresponding in cross-sectional dimensions to the base and overlying the spine, the frangible ligaments, the paddleboards and the microelectric wires on the base.

6. A package according to claim 5 wherein the base and the cover are formed from stiff paperboard and are releasably held in the position of claim 5 by one or more rubber bands.

7. A package according to claim 4 wherein the projections in said first recessed tray extend through the openings in the spine and into engagement with a second recessed tray on top of said first recessed tray.

* * * * *